(12) United States Patent
Nagaraj (10) Patent No.: US 8,117,514 B2
(45) Date of Patent: Feb. 14, 2012

(54) METHODS AND APPARATUS FOR ENCODING DATA IN A COMMUNICATION NETWORK

(75) Inventor: Thadi M. Nagaraj, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1058 days.

(21) Appl. No.: 11/691,146

(22) Filed: Mar. 26, 2007

(65) Prior Publication Data

US 2008/0114711 A1    May 15, 2008

Related U.S. Application Data (60) Provisional application No. 60/865,626, filed on Nov. 13, 2006.

(51) Int. Cl.
*H03M 13/00* (2006.01)
(52) U.S. Cl. .......... 714/752; 714/786; 714/799
(58) Field of Classification Search .......... 714/752, 714/755, 786, 799
See application file for complete search history.

(56) References Cited

U.S. PATENT DOCUMENTS

| | | | |
|---|---|---|---|
| 5,054,066 A | | 10/1991 | Riek et al. |
| 5,594,919 A | * | 1/1997 | Turkowski .......... 712/300 |
| 6,278,783 B1 | | 8/2001 | Kocher et al. |
| 6,441,601 B1 | * | 8/2002 | Clark et al. .......... 324/76.52 |
| 6,704,354 B1 | * | 3/2004 | Kim et al. .......... 375/229 |
| 6,854,077 B2 | * | 2/2005 | Chen et al. .......... 714/702 |
| 7,093,179 B2 | * | 8/2006 | Shea .......... 714/755 |
| 7,200,792 B2 | * | 4/2007 | Kim et al. .......... 714/755 |
| 7,502,987 B2 | * | 3/2009 | Kyung et al. .......... 714/781 |
| 7,519,895 B2 | * | 4/2009 | Kyung et al. .......... 714/780 |
| 7,523,377 B2 | * | 4/2009 | Halter .......... 714/755 |
| 7,581,157 B2 | * | 8/2009 | Oh et al. .......... 714/781 |

FOREIGN PATENT DOCUMENTS

EP   1511177 A2   3/2005

(Continued)

OTHER PUBLICATIONS

Wolfgang Brauneis and Hilmar Linder: "A New Class of Erasure Codes and its Application to Scalable Mutticast Content Delivery" Internet Article, [Online] May 2005, XP002482357 Retrieved from the Internet: URL:http://www.telenor.no/broadwan/BROADWAN_CD/PublicationsBrauneis_Erasure_Codes_0CG_May2005.pdf> [retrieved on May 30, 2008].

(Continued)

*Primary Examiner* — Esaw Abraham
(74) *Attorney, Agent, or Firm* — Gerald P. Joyce, III (57) ABSTRACT

Methods and apparatus for encoding data in a communication network. In an aspect, a method is provided for coding data. The method includes generating one or more permutations of the data, determining weights associated with each permutation, calculating one or more code packets from each permutation based on the associated weights, and multiplexing the data and the one or more code packets into a code packet stream. In an aspect, an apparatus is provided for coding data. The apparatus includes permutation logic configured to generate one or more permutations of the data, and weight logic configured to determine weights associated with each permutation. The apparatus also includes processing logic configured to calculate one or more code packets from each permutation based on the associated weights, and a multiplexer configured to multiplex the data and the one or more code packets into a code packet stream.

12 Claims, 6 Drawing Sheets

FOREIGN PATENT DOCUMENTS

EP    1598942 A1    11/2005

OTHER PUBLICATIONS

International Search Report—PCT/US07/083762, International Search Authority—European Patent Office—Jun. 17, 2008.
Written Opinion—PCT/US07/083762, International Search Authority—European Patent Office—Jun. 17, 2008.
Brauneis, W. et al.: "A New Class of Erasure Codes and its Application to Scalable multicast Content Delivery" Internet Article, May 2005.
Shokrollahi, Amin: "Raptor Codes", Sep. 19, 2005.
Gallager, RG, "Low-Density Parity-Check Codes", Cambridge, MA: MIT Press, 1963.
International Search Report—PCT/US07/083762—International Search Authority, European Patent Office—Jun. 17, 2008.
Written Opinion—PCT/US07/083762—International Search Authority, European Patent Office—Jun. 17, 2008.
Taiwanese Search report—096142904—TIPO—Nov. 27, 2010.
061477, Singapore Office Action, Drew & Napier LLC, pp. 1-15 (Dec. 17, 2010).

* cited by examiner

METHODS AND APPARATUS FOR ENCODING DATA IN A COMMUNICATION NETWORK

CROSS REFERENCES TO RELATED APPLICATIONS

The present application for patent claims priority to Provisional Application No. 60/865,626 entitled "METHOD FOR ERASURE RECOVERY USING A PARALLEL CONCATENATED LOW DENSITY GENERATOR MATRIX CODE" filed Nov. 13, 2006, and assigned to the assignee hereof and hereby expressly incorporated by reference herein.

BACKGROUND

1. Field

The present application relates generally to the operation of data networks, and more particularly, to methods and apparatus for encoding data in a communication network.

2. Background

In typical wireless delivery systems, content is delivered to portable devices over a multicast transmission channel. The content is in the form of code packets that are coded to overcome packet losses that may occur as packets are transmitted over the transmission channel. An encoder at a transmitter takes the original data packets and produces code packets that are transmitted to one or more devices. Because of noise or other degrading transmission effects, a subset of the code packets is received at any particular device. The received code packets are decoded to recover the original data packets.

Typically, a distribution server has an encoder that performs message coding on the data packets. The encoder takes the data packets (d) and produces code packets (C). The code packets are sent over the lossy transmission channel and some subset (C') of the code packets (C) is received by a device. A decoder at the device uses the received code packets (C') to recover the original data packets d.

The goal of message coding is to efficiently and reliably deliver content to a large number of mobile devices over a multicast wireless network. However, mobile devices are generally limited in their CPU capacity, amount of available memory, battery capacity, and the speed of their file systems. These constraints impose severe restrictions on the type of coding suitable for use in such an environment.

Typical coding schemes used to overcome packet erasures include Reed-Solomon codes and Raptor codes. Reed-Solomon codes are optimal codes in the sense that to recover k data packets, the decoder needs to receive exactly k code packets. However, the computational requirement for the decoding operation may be very high. In addition, the decoder memory requirements are also very high making it very difficult to implement on a mobile device.

Raptor codes are designed to overcome packet erasures in a network. The code consists of an inner LT-code designed to recover more than 99% of the data packets and an outer code designed to recover the rest. The computational capacity required for a Raptor decoder is far less than Reed-Solomon decoder. However, the Raptor codes are not as efficient as Reed-Solomon codes in terms of the number of code packets needed to recover all the data packets. For example, a Raptor decoder needs to receive about 1.1*k code packets to recover the k data packets with high probability.

Raptor codes are rateless codes. That is, the encoder can generate a large (potentially infinite) number of code packets, and as long as about 1.1*k code packets are received; the decoder can recover all the data packets. However, in most systems, it will not be necessary (or possible) to generate an infinite number of code packets. For example, typical distribution systems have a delivery deadline for a clip, and the distribution server has to stop transmitting code packets associated with the clip after its deadline has passed.

Another problem associated with Raptor coding is that it is a serial concatenation of codes. First an inner-code has to be decoded. These decoded packets are then fed to the outer decoder. These two steps have to be performed in sequence and this takes time to perform. Another problem with Raptor coding is that it takes more memory to perform the decoding operation than is typically available on a mobile device.

Therefore, it would be desirable to have a system that operates to provide a coding scheme that has low computational, memory, and overhead requirements for use in wireless environments.

SUMMARY

In one or more aspects, a coding system, comprising methods and apparatus, is provided that operates to code data in a communication system. In an aspect, the coding system encodes data using a low density generator matrix (LDGM) that allows decoding using a single decoding stage thereby conserving memory and minimizing computational complexity.

In an aspect, a method is provided for coding data. The method comprises generating one or more permutations of the data, determining weights associated with each permutation, calculating one or more code packets from each permutation based on the associated weights, and multiplexing the data and the one or more code packets into a code packet stream.

In an aspect, an apparatus is provided for coding data. The apparatus comprises permutation logic configured to generate one or more permutations of the data, and weight logic configured to determine weights associated with each permutation. The apparatus also comprises processing logic configured to calculate one or more code packets from each permutation based on the associated weights, and a multiplexer configured to multiplex the data and the one or more code packets into a code packet stream.

In an aspect, an apparatus is provided for coding data. The apparatus comprises means for generating one or more permutations of the data, and means for determining weights associated with each permutation. The apparatus also comprises means for calculating one or more code packets from each permutation based on the associated weights, and means for multiplexing the data and the one or more code packets into a code packet stream.

In an aspect, a computer program product is provided that comprises a computer-readable medium. The computer-readable medium comprises a first set of codes for causing a computer to generate one or more permutations of data, a second set of codes for causing the computer to determine weights associated with each permutation, a third set of codes for causing the computer to calculate one or more code packets from each permutation based on the associated weights, and a fourth set of codes for causing the computer to multiplex the data and the one or more code packets into a code packet stream.

In an aspect, at least one processor is provided that is configured to perform a method for coding data. The at least one processor comprises a first module for generating one or more permutations of the data, a second module for determining weights associated with each permutation, a third module for calculating one or more code packets from each permutation based on the associated weights, and a fourth module for multiplexing the data and the one or more code packets into a code packet stream.

Other aspects of the aspects will become apparent after review of the hereinafter set forth Brief Description of the Drawings, Description, and the Claims.

BRIEF DESCRIPTION OF THE DRAWINGS

The foregoing aspects described herein will become more readily apparent by reference to the following Description when taken in conjunction with the accompanying drawings wherein.

DESCRIPTION

In one or more aspects, a coding system is provided that operates to code data in a communication system. In an aspect, the coding system encodes data using a low density generator matrix that allows decoding using a single decoding stage thereby conserving memory and minimizing computational complexity. For example, the system is suitable to encode data for transmission over a wireless communication network. The system is especially well suited for use in wireless network environments, but may be used in any type of network environment, including but not limited to, communication networks, public networks, such as the Internet, private networks, such as virtual private networks (VPN), local area networks, wide area networks, long haul networks, or any other type of data network.

Figure 1:
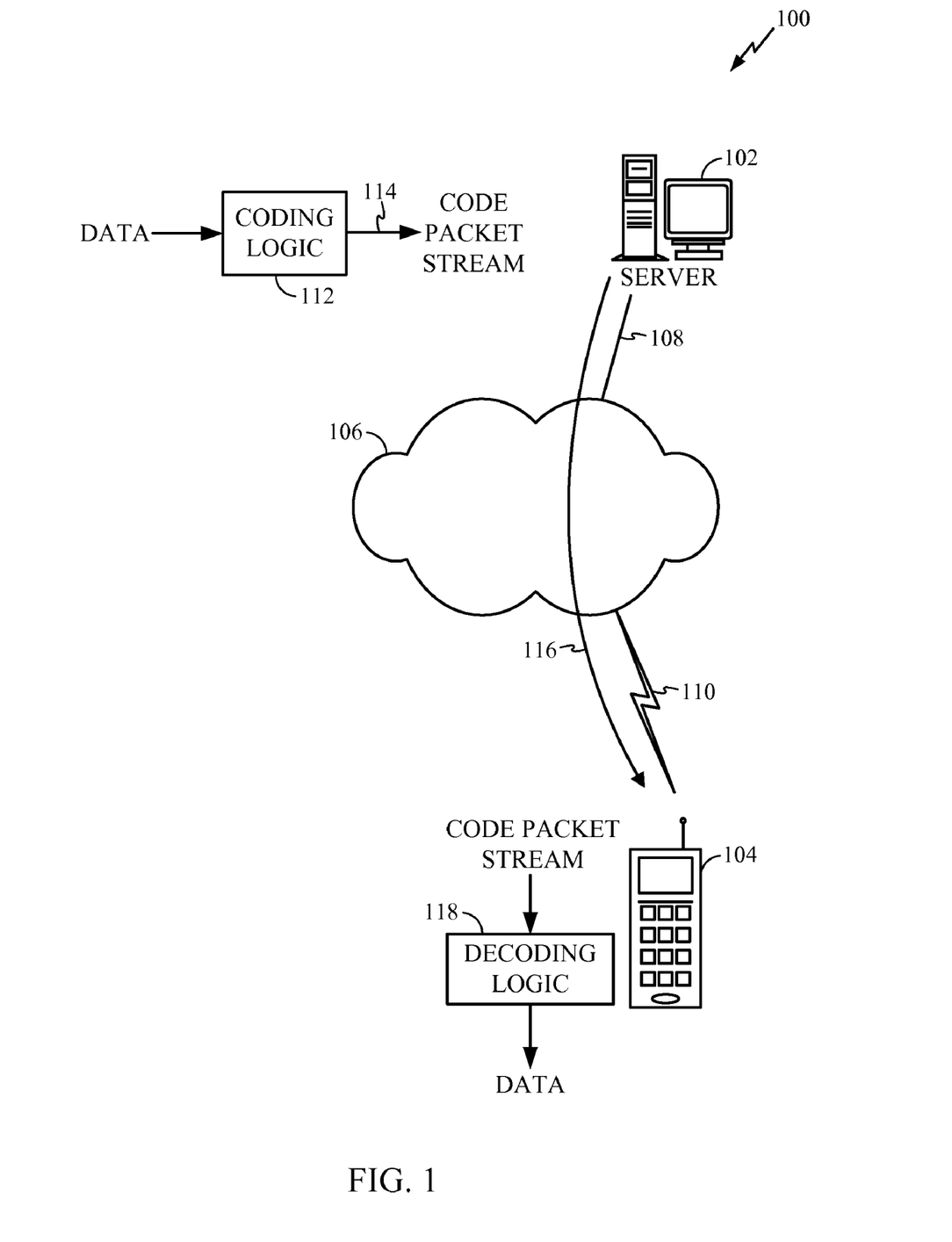
FIG. 1 shows a network that comprises an aspect of a coding system.

FIG. 1 shows a network 100 that comprises an aspect of a coding system. The network 100 comprises a server 102 that is in communication with a device 104 utilizing a data network 106. In an aspect, the server 102 operates to communicate with the network 106 using any type of communication link 108. The network 106 may be any type of wired and/or wireless network. The network 106 communicates with the device 104 using any suitable type of wireless communication link 110. The server 102 operates to transmit content and/or services to the device 104. Although only one device is shown, the system is suitable for use with any number or types of devices.

In an aspect, the server 102 comprises coding logic 112 that operates to receive data for transmission over the network 106 and encode this data to produce a code packet stream 114. In an aspect, the coding logic 112 encodes the data using parallel LDGM coding so that the generated code packets can be efficiently decoded by a receiving device. For example, the decoding process is not memory or computationally expensive.

In an aspect, each of the code packets in the code packet stream 114 comprises a packet header and/or other parameters that operate to fully describe the encoding scheme used to encode that packet. Since the packet header fully describes the coding scheme used, the system is scalable since new coding schemes may be utilized without having to update receiving devices in order for them to process received code packets.

After code packets are generated by the coding logic 112, the code packet stream 114 is transmitted to the device 104 over the network 106 as shown by path 116. When the device 104 receives the code packet stream 116 and uses its decoder 118 to decode the code packet stream to obtain the transmitted data. In an aspect, the device 104 does not need any special knowledge about the encoding scheme used because the packet headers provide all the information that is necessary to decode the received code packets. In another aspect, the device 104 is aware of the coding scheme utilized and operates to decode the received packet stream based on that knowledge.

Therefore, aspects of the coding system operate to flexibly and scalably encode data for transmission over a network. It should be noted that the network 100 illustrates just one implementation of a coding system and that other implementations are possible within the scope of the aspects.

Figure 2:
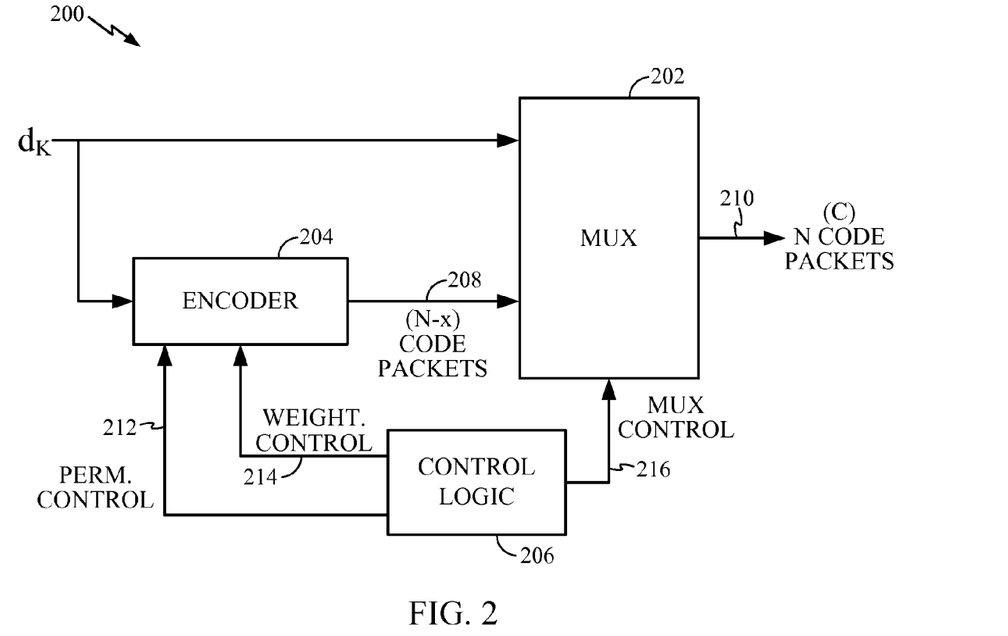
FIG. 2 shows coding logic for use in aspect of a coding system.

FIG. 2 shows coding logic 200 for use in aspects of a coding system. For example, the coding logic 200 is suitable for use as the coding logic 112 shown in FIG. 1. The coding logic 200 comprises a multiplexer (MUX) 202, encoder 204, and control logic 206.

The control logic 206 comprises a CPU, processor, gate array, hardware logic, memory elements, virtual machine, software, and/or any combination of hardware and software configured to control the operation of the encoder 204 and the MUX 202 to allow data packets ($d_K$) to be coded to form a code packet stream (C) 210 comprising "N" code packets. In an aspect, the control logic 206 operates to provide a permutation control signal 212 that identifies permutations of the input data packets $d_K$ to be used to form N-x code packets 208. For example, in an aspect, x is equal to k, however, x may be set to any other selected value. Thus, it is possible to produce more or less code packets for input to the MUX 202, which means that it is also possible to include more or less data packets in the code packet stream 210. The control logic 206 also operates to provide a weight control signal 214 that identifies weights to be used to weight the permutations of the data packets to produce the N-x code packets 208. A more detailed discussion of the permutation and weights are provided in another section of this document.

In an aspect, the encoder 204 comprises a CPU, processor, gate array, hardware logic, memory elements, virtual machine, software, and/or any combination of hardware and software. In an aspect, the encoder 204 operates to encode received data packets $d_K$ based on the permutation control signal 212 and the weight control signal 214 to produce the N-x code packets 208. The N-x code packets 208 are input to the MUX 202. In an aspect, the MUX 202 comprises any suitable hardware and/or software operable to multiplex multiple inputs to produce a multiplexed output. In an aspect, the MUX 202 receives the data packets $d_K$, the N-x code packets 208, and a MUX control signal 216. The MUX control signal 216 indicates how the MUX 202 is to multiplex the N-x code packets 208 with the data packets $d_K$ to produce the code packet stream 210.

During operation, the control logic 206 operates to generate the permutation control signal 212, the weight control signal 214, and the MUX control signal 216. Data packets $d_K$ are received for coding. The data packets $d_K$ are input to the MUX 202 and the encoder 204. The encoder 204 operates to encode the data packets based on a parallel LDGM coding mechanism using the permutation control signal 212 and the weight control signal 214 to produce the N-x code packets 208 that are input to the MUX 202. The MUX 202 operates to multiplex the N-x code packets with the data packets $d_K$ based on the MUX control signal 216 to produce the code packet stream 210. For example, the MUX 202 may evenly distribute the N-x code packets with the data packets $d_K$ to produce the code packet stream 210. Thus, the system provides a parallel LDGM coding mechanism that operates to encode data into a code packet stream for transmission over a network. The code packet stream 210 can then be quickly and efficiently decoded at a receiving device using a single stage decoder, which thereby minimized memory utilization and computational complexity.

Encoder Operation

The following is a detailed description of the operation of aspects of the coding system.

Figure 3:
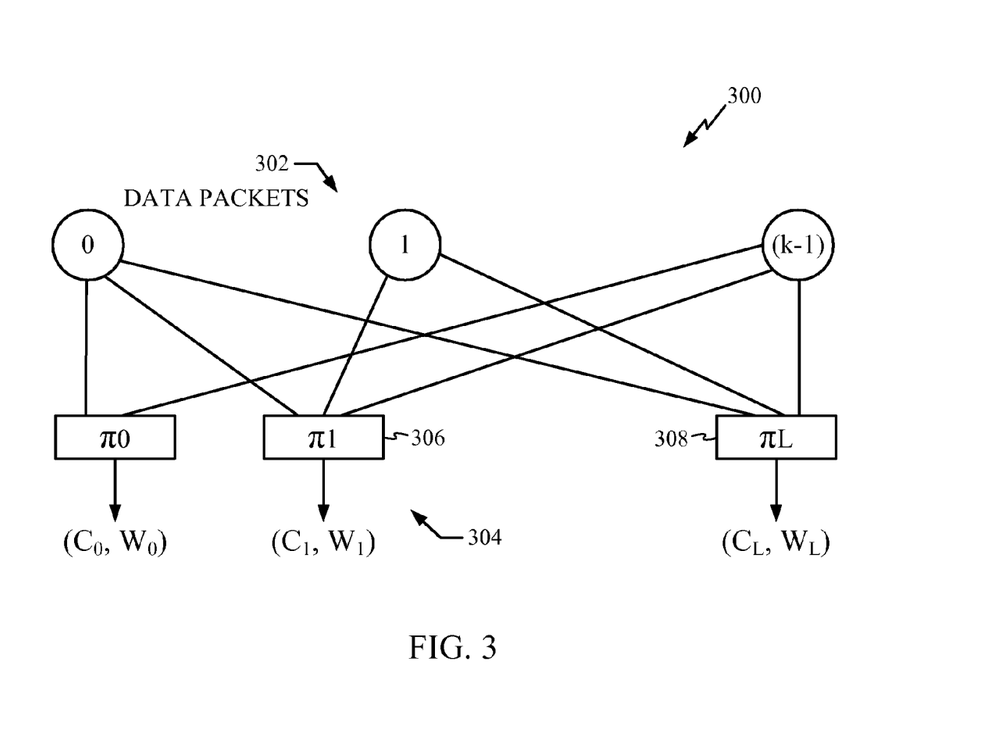
FIG. 3 shows a graphical representation that illustrates the structure of a LDGM component for use in aspects of a coding system.

FIG. 3 shows a graphical representation that illustrates the code structure of a LDGM code 300 for use in aspect of a coding system. For example, the LDGM code 300 is suitable for use in the coding logic 200 shown in FIG. 2. In FIG. 3, k data packet nodes are represented as circles shown generally at 302. The LDGM code 300 provides a parallel concatenation of legs (L+1) where the legs are represented by the rectangles and shown generally at 304.

Referring now to leg 306, this leg randomly permutes the k data packets 302 and this operation is represented as π1. The leg 306 generates $C_1$ code packets each of weight $W_1$. Similarly, the permutation operation of the leg 308 is represented as πL, and this leg generates $C_L$ code packets each of weight $W_L$. It should be noted that the leg π0 operates based on $W_0=1$ and $C_0$ equal to the number of data packets (i.e., equal to x of the coding logic 200) so that the output of this leg is simply the data packets. It should also be noted that the code packets generated by the legs 1 thru L comprise the (N-x) code packets of the encoder 208.

Consider the general case of leg J that generates $C_J$ code packets of weight $W_J$. The leg J randomly permutes the k data packets as represented by πJ. The first code packet generated by the leg J uses the first $W_J$ entries from the permuted set of data packets. The second code packet uses the next $W_J$ entries from the permuted set of data packets and so on. In matrix form, the code packets generated by leg J can be represented as;

$$G(C_J, W_J) P_J D$$

where D is the vector representing the k data symbols and $P_J$ is a (k×k) permutation matrix. The matrix $G(C_J, W_J)$ is a ($C_J$×k) matrix with a stair case structure. The first row of $G(C_J, W_J)$ has the entries 1 thru $W_J$ equal to 1 and the rest of the entries equal to 0. The second row of $G(C_J, W_J)$ has entries $W_J+1$ thru $2*W_J$ equal to 1 and the rest of the entries equal to 0 and so on.

The resulting generator matrix of the entire code can be represented as;

$$G = \begin{bmatrix} G(C_0, 1)P_0 \\ G(C_1, W_1)P_1 \\ \ldots \\ G(C_L, W_L)P_L \end{bmatrix}$$

and the code symbols C are the product of G and the data symbols D.

Thus, in an aspect, the system operates to generate N coded packets that comprise a combination of the k data packets and (N-x) code packets. The N coded packets are generated by (L+1) legs that are numbered 0 thru L. The first leg uses permutation matrix $P_0$ and $G(C_0, W_0)$. In the case of a systematic code, $P_0$ is the identity matrix, $C_0$ is k, and $W_0$ is 1. Thus, the $0^{th}$ leg generates k code packets each of weight 1.

As an example, consider a systematic code with k=4 and N=8. It will be assumed that the number of legs is three (L=3) and the (C, W) values are as shown in the table below.

| Leg | C | W |
|---|---|---|
| 1 | 2 | 2 |
| 2 | 1 | 3 |
| 3 | 1 | 4 |

The $G(C_1, W_1)$ matrix is shown below.

$$\begin{bmatrix} 1 & 1 & 0 & 0 \\ 0 & 0 & 1 & 1 \end{bmatrix}$$

The $G(C_2, W_2)$ matrix is shown below.

$$\begin{bmatrix} 1 & 1 & 1 & 0 \end{bmatrix}$$

An instance of a generator matrix G of the code is shown below.

$$\begin{bmatrix} 1 & 0 & 0 & 0 \\ 0 & 1 & 0 & 0 \\ 0 & 0 & 1 & 0 \\ 0 & 0 & 0 & 1 \\ 1 & 1 & 0 & 0 \\ 0 & 0 & 1 & 1 \\ 1 & 0 & 1 & 1 \\ 1 & 1 & 1 & 1 \end{bmatrix}$$

In general, the matrix G is a sparse matrix and hence the code is a Low Density Generator Matrix code.

Figure 4:
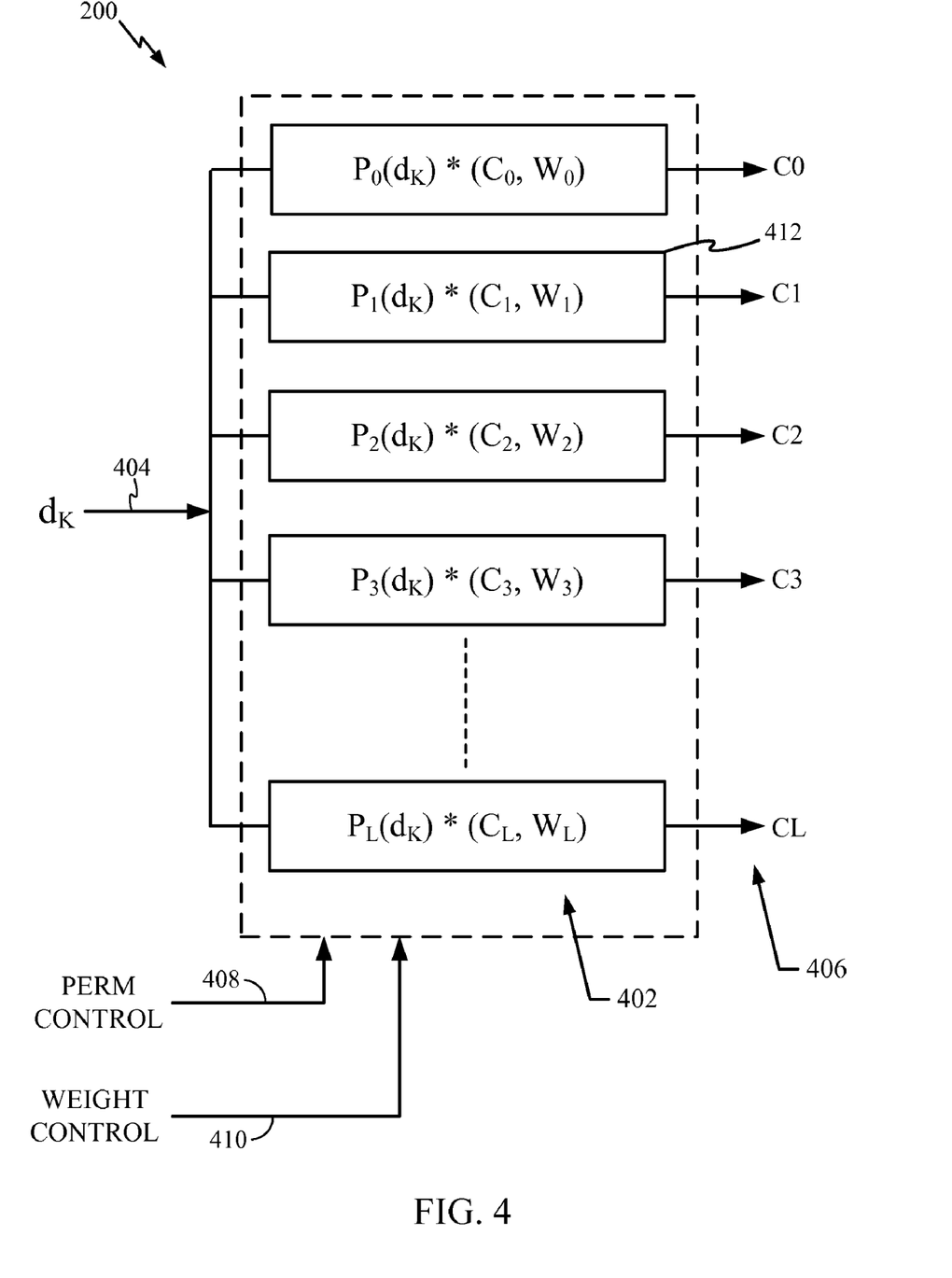
FIG. 4 shows a functional diagram of an encoder for coding data in aspects of a coding system.

FIG. 4 shows a functional diagram of the coding logic 200 for coding data in aspects of a coding system. The coding logic 200 comprises (L+1) legs, shown generally at 402, where each leg comprises a code packet generator that operates to receive data packets 404 and produce code packets (C) 406. Each of the generators utilizes a permutation (P) of the data packets 404 and selected weights (W) to produce the code packets 406. For example, the generator 412 uses a first permutation ($P_1$) of the data packets 404 and a first set of weights ($W_1$) to form C1 code packets. For example, the number C1 may range in value from one to any selected number of code packets. Likewise, the other generators form code packets using selected permutations and associated weights.

In an aspect, the generators operate to determine the permutations that they will use based on a permutation control signal 408. For example, the permutation control signal 408 is provided by the control logic 206 shown in FIG. 2. The permutation control signal 408 describes and/or selects the permutation of the data packets that each generator will use to produce code packets. For example, in an aspect, each leg comprises a random number generator is initialized with a different seed and thus randomly determining the permutations for each leg. In another aspect, a number p is selected that is relatively prime to k, and an initial seed a0 is also selected. Then a1=(a0+P) modulo k, and a2=(a1+p) modulo k, and so on. In this case, each leg selects a different value for p and a0.

Furthermore, a weight control signal 410 is also provided to the generators by the control logic 206 that describes and/or selects the weights that each generator will use to weight the associated permutation of the data packets to produce the desired number of code packets. For example, in an aspect, the weights are fixed beforehand. In another aspect, the weights are determined each time a set of data packets need to be coded.

In an aspect, the permutation control signal 408 and the weight control signal 410 operate to select pre-defined permutations and weights, and/or are used to generate the permutations and weights that are to be used by each leg. Thus, the operation of the coding logic 200 produces code packets that represent the sum (i.e., C0+C1+C2+C3+ . . . +CL) of all code packets produced the by generators 402.

In an aspect, each code packet contains information about the leg from which it was generated. For example, each code packet contains information about the permutations and weights used to generate that code packet. In another aspect, the entire structure of the legs may be made known beforehand so that any receiving device will be able to process received code packets.

Figure 5:
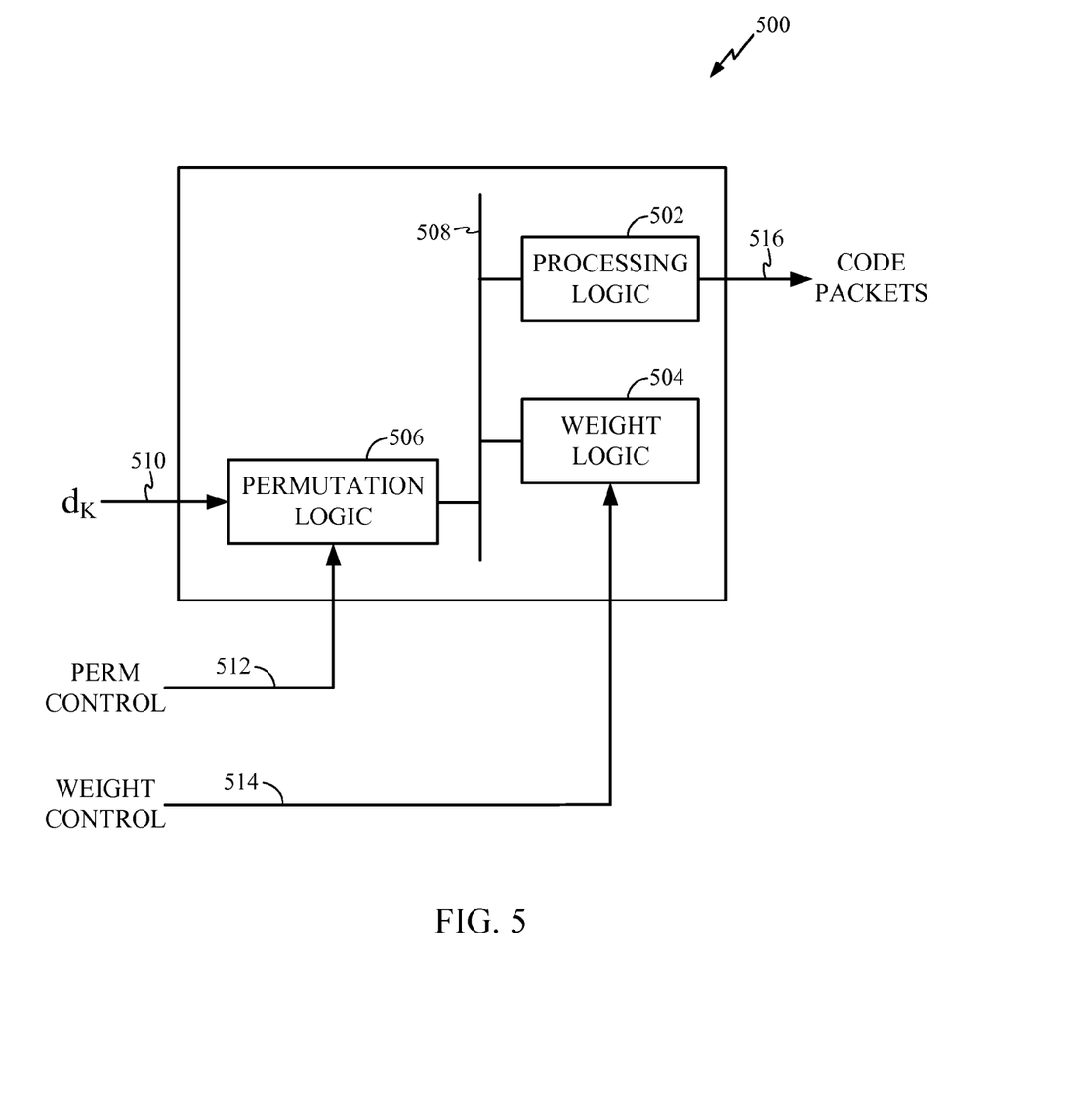
FIG. 5 shows a code packet generator for use in aspects of a coding system.

FIG. 5 shows a code packet generator 500 for use in aspects of a coding system. For example, the generator 500 is suitable for use in each leg 402 shown in FIG. 4. The generator 500 comprises processing logic 502, weight logic 504, and permutation logic 506 all coupled to a data bus 508.

The permutation logic 506 comprises a CPU, processor, gate array, hardware logic, memory elements, virtual machine, software, and/or any combination of hardware and software. The permutation logic 506 operates to receive data packets 510 and produce data permutations based on a permutation control signal 512. For example, in an aspect, a data permutation comprises any desired set selected from the data packets.

In an aspect, the weight logic 504 comprises an array of values that are to be used to weight the data permutations to form code packets. For example, to form a code packet, each data item in a data permutation is given an associated weight. The weighted data is then combined to form a code packet. In an aspect, a weight control signal 514 is used to determine weights that are to be used with each data permutation to produce code packets.

The processing logic 502 comprises a CPU, processor, gate array, hardware logic, memory elements, virtual machine, software, and/or any combination of hardware and software. In an aspect, the processing logic 502 operates to combine weighted data permutations to generate the code packets 516. For example, the weighted data values are combined by the processing logic 502 using an exclusive OR function (XOR).

In an aspect, the coding system comprises one or more program instructions ("instructions") or sets of "codes" stored on a computer-readable medium, which when executed by at least one processor, for instance, a processor at the processing logic 502, provides the functions described herein. For example, the sets of codes may be loaded into the processing logic 502 from a computer-readable medium, such as a floppy disk, CDROM, memory card, FLASH memory device, RAM, ROM, or any other type of memory device or computer-readable medium that interfaces to the processing logic 502. In another aspect, the sets of codes may be downloaded into the processing logic 502 from an external device or network resource. The sets of codes, when executed, provide aspects of a coding system as described herein.

Figure 6:
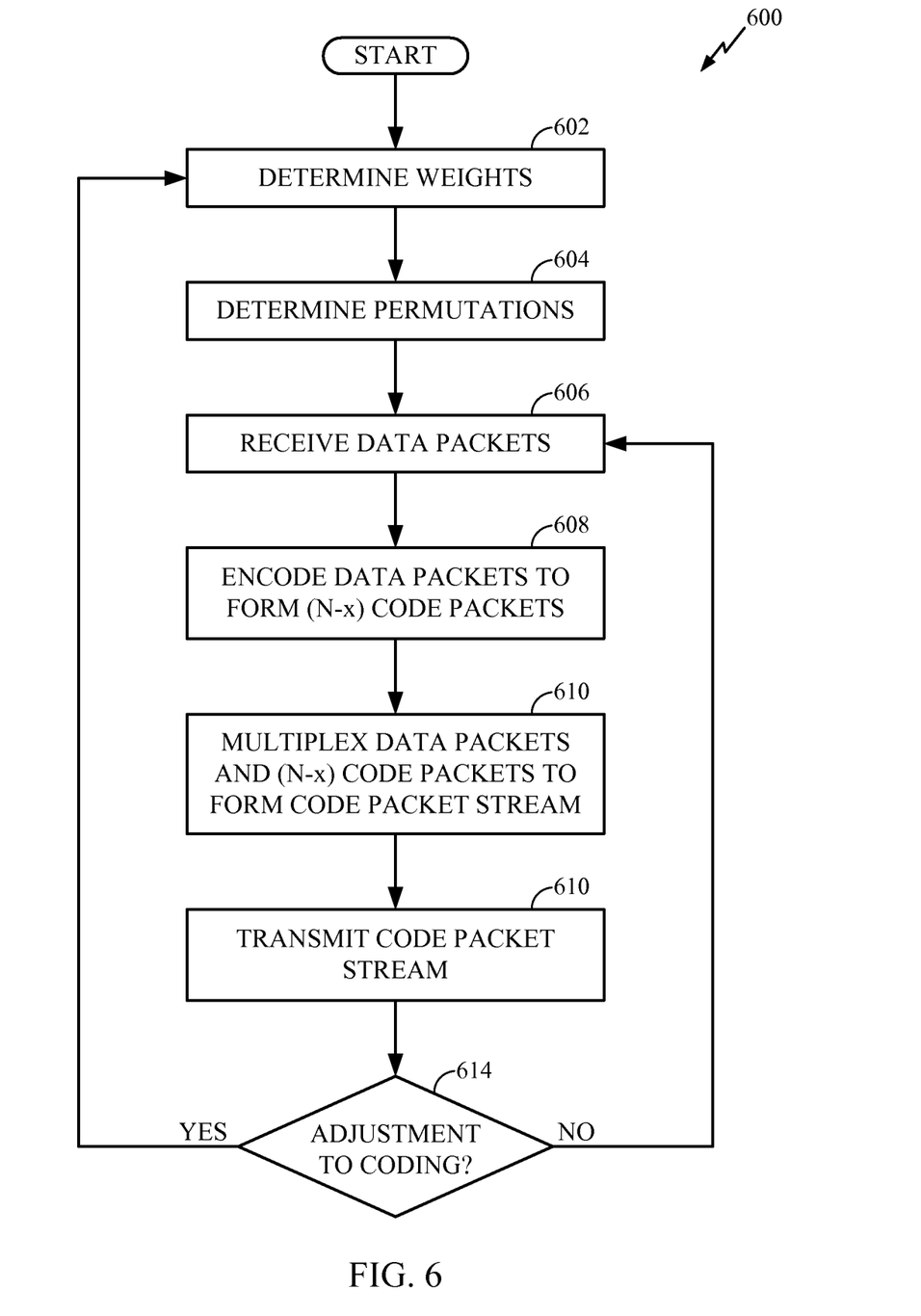
FIG. 6 shows a method for use in aspects of a coding system.

FIG. 6 shows a method 600 for use in aspects of a coding system. For clarity, the method 600 is described herein with reference to the coding logic 200 shown in FIG. 2 and the generator 500 shown in FIG. 5. For example, in an aspect, the control logic 206 executes one or more sets of codes to control the coding logic 200 to perform the functions described below.

At block 602, weights for each leg an encoder are determined. In an aspect, for each leg of the encoder 204 the weight logic 504 determines weights based on the weight control signal 514. For example, the weights describe how data elements of a data permutation are combined to form a code symbol.

At block 604, data permutations for each leg of an encoder are determined. In an aspect, for each leg of the encoder 204 the permutation logic 506 determines data permutations based on the permutation control signal 512. For example, a data permutation comprises any portion of data items selected from the received data values 510.

At block 606, data values are received. In an aspect, the coding logic 200 operates to receive the $d_k$ data values for coding.

At block 608, N-x code packets are generated. For example, the encoder 204 operates to encode the $d_k$ data values and generate the N-x code packets 208. In an aspect, the N-x code packets are formed in accordance with the coding described above. For example, each leg of the encoder 204 has an associated data permutation that is weighted with associated weights, and the results are combined by the processing logic 502 to form a selected number of code packets. The sum of the code packets produced by the legs of the encoder 204 form N-x code packets.

At block 610, the data and N-x code packets are multiplexed into a code packet stream. For example, the MUX 202 operates to receive the data and N-x code packets 208 and multiplexes them together to form the code packet stream 210.

At block 612, the code packet stream is transmitted to one or more receiving devices. For example, the code packet stream 210 is transmitted over the network 106 to the device 104 as illustrated in FIG. 1.

At block 614, a test is performed to determine if any adjustments to the coding scheme need to be performed. In an aspect, the control logic 206 operates to determine if any adjustments are needed. If there are no adjustments to the current coding scheme, then the method proceeds to block 606 to continue coding data for transmission. If there are adjustments to the coding scheme, then the method proceeds to block 602 where new permutations and/or weights can be determined.

Thus, the method 600 operates to provide an aspect of a coding system. It should be noted that the method 600 represents just one implementation and that other implementations are possible within the scope of the aspects.

Code Design

The following description illustrates the design of an LDGM code for use in a coding system. It should be noted that the design illustrated below is just one implementation and that other implementations can be provided by aspects of the coding system.

The number of legs L and the value of $(C_i, W_i)$ for each leg determines the code performance. In an aspect, the LDGM code that is selected satisfies the following constraints;

$$(N-x) = \sum_{i=1}^{L} C_i$$

where for each leg $L_i$, from 1 thru L $0 < C_i W_i \leq k$ $W_i > 1$

It will be assumed that in a particular coding the fraction of code packets with weight w [w>1] is denoted by $\Omega_w$. Then the number of code packets of weight w is $[(N-x)*\Omega_w]$. The number of legs that can be used to generate these packets is;

$$L_W = \left\lceil \frac{(N-x)\Omega_w}{\left\lfloor \frac{k}{W} \right\rfloor} \right\rceil$$

The $[(N-x)*\Omega_w]$ code packets are then uniformly distributed across these $L_w$ legs. Thus, instead of determining L and the $(C_i, W_i)$ values, a degree distribution of the code is determined. This degree distribution specifies the weights of the code packets and the fraction of code packets for each particular weight.

Figure 7:
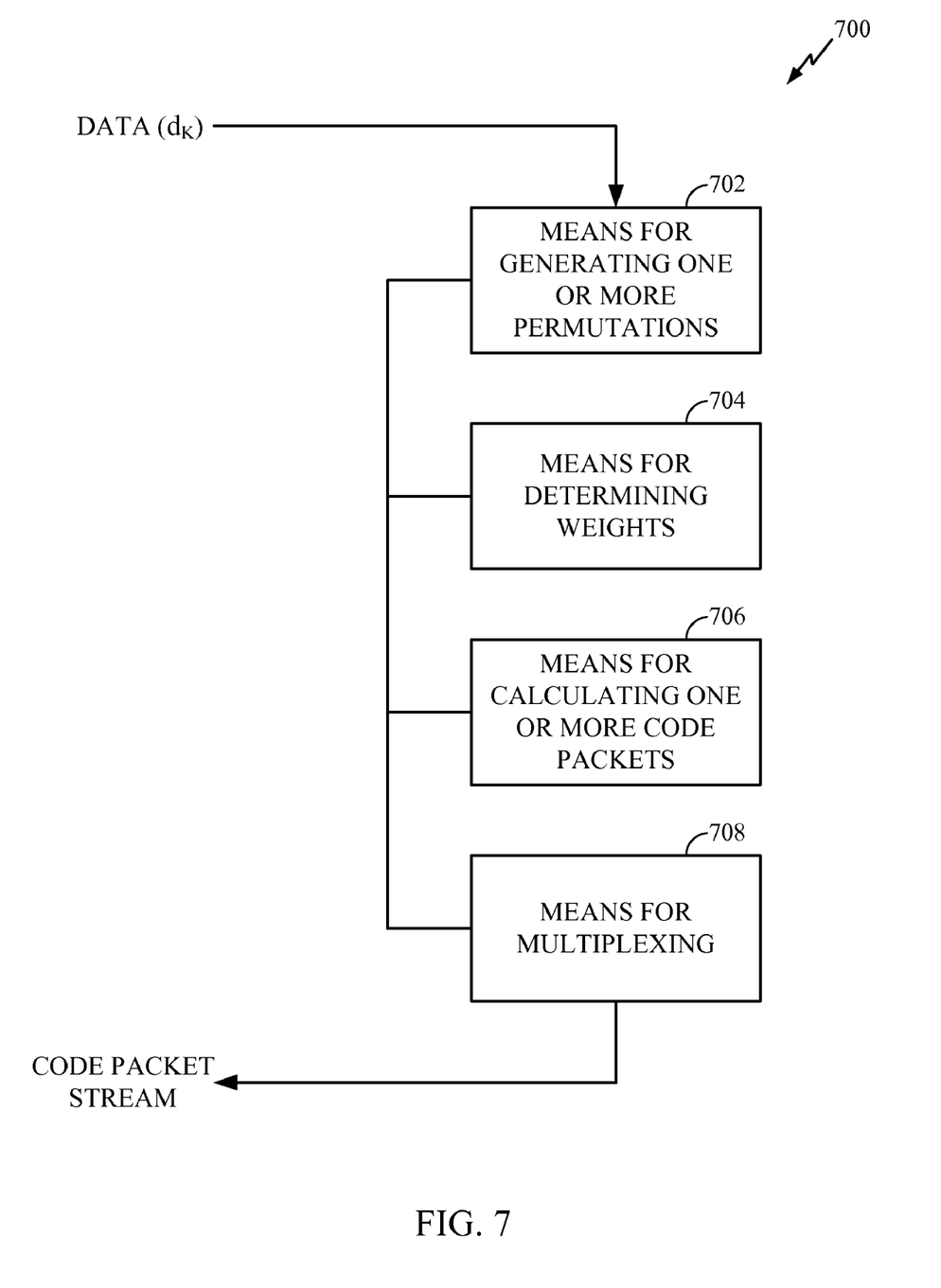
FIG. 7 shows coding logic for use in aspects of a coding system.

FIG. 7 shows coding logic 700 for use in aspects of a coding system. For example, the coding logic 700 is suitable for use as the coding logic 112 shown in FIG. 1. In an aspect, the coding logic 700 is implemented by at least one processor comprising one or more modules configured to provide aspects of a coding system as described herein. For example, each module comprises hardware, software, or any combination thereof.

The coding logic 700 comprises a first module comprising means (702) for generating one or more permutations, which in an aspect comprises the permutation logic 506. The coding logic 700 also comprises a second module comprising means (704) for determining weights, which in an aspect comprises the weight logic 504. The coding logic 700 also comprises a third module comprising means (706) for calculating one or more code packets, which in an aspect comprises the processing logic 502. The coding logic 700 also comprises a fourth module comprising means (708) for multiplexing data and the one or more code packets to form a code packet stream, which in an aspect comprises the MUX 202.

The various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Units or modules for performing functions, something like that The steps of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium is coupled to the processor, such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The description of the disclosed aspects is provided to enable any person skilled in the art to make or use the present invention. Various modifications to these aspects may be readily apparent to those skilled in the art, and the generic principles defined herein may be applied to other aspects, e.g., in an instant messaging service or any general wireless data communication applications, without departing from the spirit or scope of the invention. Thus, the present invention is not intended to be limited to the aspects shown herein but is to be accorded the widest scope consistent with the principles and novel features disclosed herein. The word "exemplary" is used exclusively herein to mean "serving as an example, instance, or illustration." Any aspect described herein as "exemplary" is not necessarily to be construed as preferred or advantageous over other aspects.

Accordingly, while aspects of a coding system have been illustrated and described herein, it will be appreciated that various changes can be made to the aspects without departing from their spirit or essential characteristics. Therefore, the disclosures and descriptions herein are intended to be illustrative, but not limiting, of the scope of the invention, which is set forth in the following claims.

What is claimed is:

1. A method for coding data in a wireless communication system, the method comprising:
generating one or more permutations of the data;
determining weights associated with each permutation;
calculating, by a processor, one or more code packets from each permutation based on the associated weights, wherein each weight indicates of an amount of the associated permutation used in calculating each of the one or more code packets;
multiplexing the data and the one or more code packets into a code packet stream; and
transmitting the code packet stream over a network.

2. The method of claim 1, wherein said calculating comprises calculating the one or more code packets to produce a total of (N-k) code packets, wherein the data comprises k data packets and the code packet stream comprises a total of N coded packets.

3. The method of claim 2, wherein said multiplexing comprises multiplexing the (N-k) code packets with the k data packets to produce the code packet stream.

4. The method of claim 1, wherein said calculating comprises calculating the one or more code packets using a low density generator matrix that describes the permutations and the weights.

5. The method of claim 1, wherein said calculating comprises calculating the one or more code packets using a low density generator matrix expressed as;

$$G = \begin{bmatrix} G(C_0, 1)P_0 \\ G(C_1, W_1)P_1 \\ \ldots \\ G(C_L, W_L)P_L \end{bmatrix}.$$

6. The method of claim 1, wherein said generating comprises randomly generating each of the one or more permutations of the data.

7. A computer program product embodied on a computer-readable medium and comprising codes that, when executed, cause a computer to perform the following steps:
generate one or more permutations of data;
determine weights associated with each permutation;
calculate one or more code packets from each permutation based on the associated weights, wherein each weight indicates an amount of each permutation used to calculate the one or more code packets;
multiplex the data and the one or more code packets into a code packet stream; and
transmit the code packet stream over a network.

8. The computer-readable medium of claim 7, further comprising codes that, when executed, cause the computer to calculate a total of (N-k) code packets, wherein k represents a number of the data packets and the code packet stream comprises a total of N coded packets.

9. The computer-readable medium of claim 8, further comprising codes that, when executed, cause the computer to multiplex the (N-k) code packets with the k data packets to produce the code packet stream.

10. The computer-readable medium of claim 7, further comprising codes that, when executed, cause the computer to calculate the one or more code packets using a low density generator matrix that describes the permutations and the weights.

11. The computer-readable medium of claim 7, further comprising codes that, when executed, cause the computer to calculate the one or more code packets using a low density generator matrix expressed as;

$$G = \begin{bmatrix} G(C_0, 1)P_0 \\ G(C_1, W_1)P_1 \\ \ldots \\ G(C_L, W_L)P_L \end{bmatrix}.$$

12. The computer-readable medium of claim 7, further comprising codes that, when executed, cause the computer to randomly generate each of the one or more permutations of the data.

* * * * *